(12) United States Patent
Rogers et al.

(10) Patent No.: US 12,482,633 B2
(45) Date of Patent: Nov. 25, 2025

(54) APPARATUS AND METHOD FOR DELIVERING A PLURALITY OF WAVEFORM SIGNALS DURING PLASMA PROCESSING

(71) Applicant: Applied Materials, Inc., Santa Clara, CA (US)

(72) Inventors: James Rogers, Los Gatos, CA (US); Katsumasa Kawasaki, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 387 days.

(21) Appl. No.: 18/199,519

(22) Filed: May 19, 2023

(65) Prior Publication Data
US 2023/0298856 A1 Sep. 21, 2023

Related U.S. Application Data

(62) Division of application No. 17/884,423, filed on Aug. 9, 2022, now Pat. No. 11,694,876.
(Continued)

(51) Int. Cl.
*H01J 37/32* (2006.01)

(52) U.S. Cl.
CPC .. *H01J 37/32165* (2013.01); *H01J 37/32128* (2013.01); *H01J 37/32568* (2013.01);
(Continued)

(58) Field of Classification Search
CPC .......... H01J 37/32165; H01J 37/32128; H01J 37/32568; H01J 37/32183; H01J 2237/3341; H01J 2237/3343
(Continued)

(56) References Cited

U.S. PATENT DOCUMENTS

| 4,070,589 A | 1/1978 | Martinkovic |
| 4,340,462 A | 7/1982 | Koch |

(Continued)

FOREIGN PATENT DOCUMENTS

| CN | 102084024 A | 6/2011 |
| CN | 101707186 B | 2/2012 |

(Continued)

OTHER PUBLICATIONS

Japan Office Action issued to patent application No. 2024-533335 on Apr. 30, 2025.
(Continued)

*Primary Examiner* — Charlee J. C. Bennett
(74) *Attorney, Agent, or Firm* — Patterson + Sheridan, LLP

(57) ABSTRACT

Embodiments of the present disclosure generally relate to a system used in a semiconductor device manufacturing process. More specifically, embodiments provided herein generally include apparatus and methods for synchronizing and controlling the delivery of an RF bias voltage signal and a pulsed voltage waveform to one or more electrodes within a plasma processing chamber. Embodiments of the disclosure include a method and apparatus for synchronizing a pulsed radio frequency (RF) waveform to a pulsed voltage (PV) waveform, such that the pulsed RF waveform is on during a first stage of the PV waveform and off during a second stage. The first stage of the PV waveform includes a sheath collapse stage. The second stage of the PV waveform includes an ion current stage.

20 Claims, 6 Drawing Sheets

Related U.S. Application Data

(60) Provisional application No. 63/287,433, filed on Dec. 8, 2021.

(52) U.S. Cl.
CPC . *H01J 37/32183* (2013.01); *H01J 2237/3341* (2013.01); *H01J 2237/3343* (2013.01)

(58) Field of Classification Search
USPC .................................................. 156/345.28
See application file for complete search history.

(56) References Cited

U.S. PATENT DOCUMENTS

| | | |
|---|---|---|
| 4,464,223 A | 8/1984 | Gorin |
| 4,504,895 A | 3/1985 | Steigerwald |
| 4,585,516 A | 4/1986 | Corn et al. |
| 4,683,529 A | 7/1987 | Bucher, II |
| 4,931,135 A | 6/1990 | Horiuchi et al. |
| 4,992,919 A | 2/1991 | Lee et al. |
| 5,099,697 A | 3/1992 | Agar |
| 5,140,510 A | 8/1992 | Myers |
| 5,242,561 A | 9/1993 | Sato |
| 5,449,410 A | 9/1995 | Chang et al. |
| 5,451,846 A | 9/1995 | Peterson et al. |
| 5,464,499 A | 11/1995 | Moslehi et al. |
| 5,554,959 A | 9/1996 | Tang |
| 5,595,627 A | 1/1997 | Inazawa et al. |
| 5,597,438 A | 1/1997 | Grewal et al. |
| 5,610,452 A | 3/1997 | Shimer et al. |
| 5,698,062 A | 12/1997 | Sakamoto et al. |
| 5,716,534 A | 2/1998 | Tsuchiya et al. |
| 5,770,023 A | 6/1998 | Sellers |
| 5,796,598 A | 8/1998 | Nowak et al. |
| 5,810,982 A | 9/1998 | Sellers |
| 5,882,424 A | 3/1999 | Taylor et al. |
| 5,928,963 A | 7/1999 | Koshiishi |
| 5,933,314 A | 8/1999 | Lambson et al. |
| 5,948,704 A | 9/1999 | Benjamin et al. |
| 5,997,687 A | 12/1999 | Koshimizu |
| 6,043,607 A | 3/2000 | Roderick |
| 6,051,114 A | 4/2000 | Yao et al. |
| 6,055,150 A | 4/2000 | Clinton et al. |
| 6,074,518 A | 6/2000 | Imafuku et al. |
| 6,089,181 A | 7/2000 | Suemasa et al. |
| 6,099,697 A | 8/2000 | Hausmann |
| 6,110,287 A | 8/2000 | Arai et al. |
| 6,117,279 A | 9/2000 | Smolanoff et al. |
| 6,125,025 A | 9/2000 | Howald et al. |
| 6,133,557 A | 10/2000 | Kawanabe et al. |
| 6,187,685 B1 | 2/2001 | Hopkins et al. |
| 6,198,616 B1 | 3/2001 | Dahimene et al. |
| 6,201,208 B1 | 3/2001 | Wendt et al. |
| 6,214,162 B1 | 4/2001 | Koshimizu |
| 6,252,354 B1 | 6/2001 | Collins et al. |
| 6,277,506 B1 | 8/2001 | Okamoto |
| 6,309,978 B1 | 10/2001 | Donohoe et al. |
| 6,313,583 B1 | 11/2001 | Arita et al. |
| 6,355,992 B1 | 3/2002 | Via |
| 6,358,573 B1 | 3/2002 | Raoux et al. |
| 6,367,413 B1 | 4/2002 | Sill et al. |
| 6,392,187 B1 | 5/2002 | Johnson |
| 6,395,641 B2 | 5/2002 | Savas |
| 6,413,358 B2 | 7/2002 | Donohoe |
| 6,423,192 B1 | 7/2002 | Wada et al. |
| 6,433,297 B1 | 8/2002 | Kojima et al. |
| 6,435,131 B1 | 8/2002 | Koizumi |
| 6,456,010 B2 | 9/2002 | Yamakoshi et al. |
| 6,483,731 B1 | 11/2002 | Isurin et al. |
| 6,535,785 B2 | 3/2003 | Johnson et al. |
| 6,621,674 B1 | 9/2003 | Zahringer et al. |
| 6,664,739 B1 | 12/2003 | Kishinevsky et al. |
| 6,733,624 B2 | 5/2004 | Koshiishi et al. |
| 6,740,842 B2 | 5/2004 | Johnson et al. |
| 6,741,446 B2 | 5/2004 | Ennis |
| 6,777,037 B2 | 8/2004 | Sumiya et al. |
| 6,808,607 B2 | 10/2004 | Christie |
| 6,818,103 B1 | 11/2004 | Scholl et al. |
| 6,849,154 B2 | 2/2005 | Nagahata et al. |
| 6,861,373 B2 | 3/2005 | Aoki et al. |
| 6,896,775 B2 | 5/2005 | Chistyakov |
| 6,917,204 B2 | 7/2005 | Mitrovic et al. |
| 6,947,300 B2 | 9/2005 | Pai et al. |
| 6,962,664 B2 | 11/2005 | Mitrovic |
| 6,972,524 B1 | 12/2005 | Marakhtanov et al. |
| 7,016,620 B2 | 3/2006 | Maess et al. |
| 7,046,088 B2 | 5/2006 | Ziegler |
| 7,059,267 B2 | 6/2006 | Hedberg et al. |
| 7,104,217 B2 | 9/2006 | Himori et al. |
| 7,115,185 B1 | 10/2006 | Gonzalez et al. |
| 7,126,808 B2 | 10/2006 | Koo et al. |
| 7,183,177 B2 | 2/2007 | Al-Bayati et al. |
| 7,206,189 B2 | 4/2007 | Reynolds, III |
| 7,218,872 B2 | 5/2007 | Shimomura |
| 7,226,868 B2 | 6/2007 | Mosden et al. |
| 7,265,963 B2 | 9/2007 | Hirose |
| 7,312,974 B2 | 12/2007 | Kuchimachi |
| 7,415,940 B2 | 8/2008 | Koshimizu et al. |
| 7,479,712 B2 | 1/2009 | Richert et al. |
| 7,509,105 B2 | 3/2009 | Ziegler |
| 7,512,387 B2 | 3/2009 | Glueck |
| 7,535,688 B2 | 5/2009 | Yokouchi et al. |
| 7,586,210 B2 | 9/2009 | Wiedemuth et al. |
| 7,588,667 B2 | 9/2009 | Cerio, Jr. |
| 7,601,246 B2 | 10/2009 | Kim et al. |
| 7,609,740 B2 | 10/2009 | Glueck |
| 7,618,686 B2 | 11/2009 | Colpo et al. |
| 7,633,319 B2 | 12/2009 | Arai |
| 7,645,341 B2 | 1/2010 | Kennedy et al. |
| 7,692,936 B2 | 4/2010 | Richter |
| 7,700,474 B2 | 4/2010 | Cerio, Jr. |
| 7,705,676 B2 | 4/2010 | Kirchmeier et al. |
| 7,706,907 B2 | 4/2010 | Hiroki |
| 7,718,538 B2 | 5/2010 | Kim et al. |
| 7,740,704 B2 | 6/2010 | Strang |
| 7,758,764 B2 | 7/2010 | Dhindsa et al. |
| 7,761,247 B2 | 7/2010 | van Zyl |
| 7,782,100 B2 | 8/2010 | Steuber et al. |
| 7,821,767 B2 | 10/2010 | Fujii |
| 7,825,719 B2 | 11/2010 | Roberg et al. |
| 7,888,240 B2 | 2/2011 | Hamamjy et al. |
| 7,898,238 B2 | 3/2011 | Wiedemuth et al. |
| 7,929,261 B2 | 4/2011 | Wiedemuth |
| RE42,362 E | 5/2011 | Schuler |
| 7,977,256 B2 | 7/2011 | Liu et al. |
| 8,052,798 B2 | 11/2011 | Moriya et al. |
| 8,055,203 B2 | 11/2011 | Choueiry et al. |
| 8,083,961 B2 | 12/2011 | Chen et al. |
| 8,110,992 B2 | 2/2012 | Nitschke |
| 8,128,831 B2 | 3/2012 | Sato et al. |
| 8,133,347 B2 | 3/2012 | Gluck et al. |
| 8,140,292 B2 | 3/2012 | Wendt |
| 8,217,299 B2 | 7/2012 | Ilic et al. |
| 8,221,582 B2 | 7/2012 | Patrick et al. |
| 8,236,109 B2 | 8/2012 | Moriya et al. |
| 8,284,580 B2 | 10/2012 | Wilson |
| 8,313,612 B2 | 11/2012 | McMillin et al. |
| 8,313,664 B2 | 11/2012 | Chen et al. |
| 8,333,114 B2 | 12/2012 | Hayashi |
| 8,361,906 B2 | 1/2013 | Lee et al. |
| 8,382,999 B2 | 2/2013 | Agarwal et al. |
| 8,383,001 B2 | 2/2013 | Mochiki et al. |
| 8,384,403 B2 | 2/2013 | Zollner et al. |
| 8,399,366 B1 | 3/2013 | Takaba |
| 8,419,959 B2 | 4/2013 | Bettencourt et al. |
| 8,422,193 B2 | 4/2013 | Tao et al. |
| 8,441,772 B2 | 5/2013 | Yoshikawa et al. |
| 8,456,220 B2 | 6/2013 | Thome et al. |
| 8,460,567 B2 | 6/2013 | Chen |
| 8,542,076 B2 | 9/2013 | Maier |
| 8,551,289 B2 | 10/2013 | Nishimura et al. |
| 8,632,537 B2 | 1/2014 | McNall, III et al. |
| 8,641,916 B2 | 2/2014 | Yatsuda et al. |
| 8,685,267 B2 | 4/2014 | Yatsuda et al. |

(56) References Cited

U.S. PATENT DOCUMENTS

| | | |
|---|---|---|
| 8,704,607 B2 | 4/2014 | Yuzurihara et al. |
| 8,716,114 B2 | 5/2014 | Ohmi et al. |
| 8,716,984 B2 | 5/2014 | Mueller et al. |
| 8,796,933 B2 | 8/2014 | Hermanns |
| 8,809,199 B2 | 8/2014 | Nishizuka |
| 8,821,684 B2 | 9/2014 | Ui et al. |
| 8,828,883 B2 | 9/2014 | Rueger |
| 8,845,810 B2 | 9/2014 | Hwang |
| 8,884,523 B2 | 11/2014 | Winterhalter et al. |
| 8,884,525 B2 | 11/2014 | Hoffman et al. |
| 8,895,942 B2 | 11/2014 | Liu et al. |
| 8,907,259 B2 | 12/2014 | Kasai et al. |
| 8,916,056 B2 | 12/2014 | Koo et al. |
| 8,926,850 B2 | 1/2015 | Singh et al. |
| 8,979,842 B2 | 3/2015 | McNall, III et al. |
| 8,993,943 B2 | 3/2015 | Pohl et al. |
| 9,011,636 B2 | 4/2015 | Ashida |
| 9,042,121 B2 | 5/2015 | Walde et al. |
| 9,053,908 B2 | 6/2015 | Sriraman et al. |
| 9,101,038 B2 | 8/2015 | Singh et al. |
| 9,105,452 B2 | 8/2015 | Jeon et al. |
| 9,123,762 B2 | 9/2015 | Lin et al. |
| 9,147,555 B2 | 9/2015 | Richter |
| 9,150,960 B2 | 10/2015 | Nauman et al. |
| 9,209,032 B2 | 12/2015 | Zhao et al. |
| 9,209,034 B2 | 12/2015 | Kitamura et al. |
| 9,210,790 B2 | 12/2015 | Hoffman et al. |
| 9,228,878 B2 | 1/2016 | Haw et al. |
| 9,254,168 B2 | 2/2016 | Palanker |
| 9,355,822 B2 | 5/2016 | Yamada et al. |
| 9,384,992 B2 | 7/2016 | Narishige et al. |
| 9,396,960 B2 | 7/2016 | Ogawa et al. |
| 9,404,176 B2 | 8/2016 | Parkhe et al. |
| 9,412,613 B2 | 8/2016 | Manna et al. |
| 9,490,107 B2 | 11/2016 | Kim et al. |
| 9,495,563 B2 | 11/2016 | Ziemba et al. |
| 9,496,150 B2 | 11/2016 | Mochiki et al. |
| 9,503,006 B2 | 11/2016 | Pohl et al. |
| 9,536,713 B2 | 1/2017 | Van Zyl et al. |
| 9,564,287 B2 | 2/2017 | Ohse et al. |
| 9,576,810 B2 | 2/2017 | Deshmukh et al. |
| 9,593,421 B2 | 3/2017 | Baek et al. |
| 9,601,319 B1 | 3/2017 | Bravo et al. |
| 9,607,843 B2 | 3/2017 | Rastogi et al. |
| 9,637,814 B2 | 5/2017 | Bugyi et al. |
| 9,644,221 B2 | 5/2017 | Kanamori et al. |
| 9,651,957 B1 | 5/2017 | Finley |
| 9,663,858 B2 | 5/2017 | Nagami et al. |
| 9,666,447 B2 | 5/2017 | Rastogi et al. |
| 9,673,027 B2 | 6/2017 | Yamamoto et al. |
| 9,673,059 B2 | 6/2017 | Raley et al. |
| 9,728,429 B2 | 8/2017 | Ricci et al. |
| 9,741,544 B2 | 8/2017 | Van Zyl |
| 9,761,419 B2 | 9/2017 | Nagami |
| 9,786,503 B2 | 10/2017 | Raley et al. |
| 9,799,494 B2 | 10/2017 | Chen et al. |
| 9,805,916 B2 | 10/2017 | Konno et al. |
| 9,805,965 B2 | 10/2017 | Sadjadi et al. |
| 9,812,305 B2 | 11/2017 | Pelleymounter |
| 9,831,064 B2 | 11/2017 | Konno et al. |
| 9,852,890 B2 | 12/2017 | Mueller et al. |
| 9,865,471 B2 | 1/2018 | Shimoda et al. |
| 9,872,373 B1 | 1/2018 | Shimizu et al. |
| 9,881,820 B2 | 1/2018 | Wong et al. |
| 9,922,806 B2 | 3/2018 | Tomura et al. |
| 9,929,004 B2 | 3/2018 | Ziemba et al. |
| 9,941,097 B2 | 4/2018 | Yamazawa et al. |
| 9,972,503 B2 | 5/2018 | Tomura et al. |
| 10,041,174 B2 | 8/2018 | Matsumoto et al. |
| 10,042,407 B2 | 8/2018 | Grede et al. |
| 10,063,062 B2 | 8/2018 | Voronin et al. |
| 10,074,518 B2 | 9/2018 | Van Zyl |
| 10,085,796 B2 | 10/2018 | Podany |
| 10,090,191 B2 | 10/2018 | Tomura et al. |
| 10,102,321 B2 | 10/2018 | Povolny et al. |
| 10,109,461 B2 | 10/2018 | Yamada et al. |
| 10,115,567 B2 | 10/2018 | Hirano et al. |
| 10,115,568 B2 | 10/2018 | Kellogg et al. |
| 10,176,970 B2 | 1/2019 | Nitschke |
| 10,176,971 B2 | 1/2019 | Nagami |
| 10,181,392 B2 | 1/2019 | Leypold et al. |
| 10,199,246 B2 | 2/2019 | Koizumi et al. |
| 10,217,618 B2 | 2/2019 | Larson et al. |
| 10,217,933 B2 | 2/2019 | Nishimura et al. |
| 10,229,819 B2 | 3/2019 | Hirano et al. |
| 10,249,498 B2 | 4/2019 | Ventzek et al. |
| 10,269,540 B1 | 4/2019 | Carter et al. |
| 10,276,420 B2 | 4/2019 | Ito et al. |
| 10,282,567 B2 | 5/2019 | Miller et al. |
| 10,283,321 B2 | 5/2019 | Yang et al. |
| 10,290,506 B2 | 5/2019 | Ranjan et al. |
| 10,297,431 B2 | 5/2019 | Zelechowski et al. |
| 10,304,668 B2 | 5/2019 | Coppa et al. |
| 10,312,056 B2 | 6/2019 | Collins et al. |
| 10,320,373 B2 | 6/2019 | Prager et al. |
| 10,332,730 B2 | 6/2019 | Christie |
| 10,340,123 B2 | 7/2019 | Ohtake |
| 10,348,186 B2 | 7/2019 | Schuler et al. |
| 10,354,839 B2 | 7/2019 | Alt et al. |
| 10,373,811 B2 | 8/2019 | Christie et al. |
| 10,381,237 B2 | 8/2019 | Takeda et al. |
| 10,387,166 B2 | 8/2019 | Preston et al. |
| 10,388,544 B2 | 8/2019 | Ji et al. |
| 10,410,877 B2 | 9/2019 | Takashima et al. |
| 10,431,437 B2 | 10/2019 | Gapi 70nski et al. |
| 10,438,797 B2 | 10/2019 | Cottle et al. |
| 10,446,453 B2 | 10/2019 | Coppa et al. |
| 10,447,174 B1 | 10/2019 | Porter, Jr. et al. |
| 10,460,916 B2 | 10/2019 | Boyd, Jr. et al. |
| 10,483,100 B2 | 11/2019 | Ishizaka et al. |
| 10,510,575 B2 | 12/2019 | Kraus et al. |
| 10,522,343 B2 | 12/2019 | Tapily et al. |
| 10,553,407 B2 | 2/2020 | Nagami et al. |
| 10,580,620 B2 | 3/2020 | Carducci et al. |
| 10,593,519 B2 | 3/2020 | Yamada et al. |
| 10,658,189 B2 | 5/2020 | Hatazaki et al. |
| 10,665,434 B2 | 5/2020 | Matsumoto et al. |
| 10,672,589 B2 | 6/2020 | Koshimizu et al. |
| 10,672,596 B2 | 6/2020 | Brcka |
| 10,672,616 B2 | 6/2020 | Kubota |
| 10,707,053 B2 | 7/2020 | Urakawa et al. |
| 10,707,086 B2 | 7/2020 | Yang et al. |
| 10,707,090 B2 | 7/2020 | Takayama et al. |
| 10,714,372 B2 | 7/2020 | Chua et al. |
| 10,720,305 B2 | 7/2020 | Van Zyl |
| 10,748,746 B2 | 8/2020 | Kaneko et al. |
| 10,755,894 B2 | 8/2020 | Hirano et al. |
| 10,763,150 B2 | 9/2020 | Lindley et al. |
| 10,773,282 B2 | 9/2020 | Coppa et al. |
| 10,774,423 B2 | 9/2020 | Janakiraman et al. |
| 10,790,816 B2 | 9/2020 | Ziemba et al. |
| 10,811,227 B2 * | 10/2020 | Van Zyl ............ H01J 37/32137 |
| 10,811,296 B2 | 10/2020 | Cho et al. |
| 10,896,807 B2 | 1/2021 | Fairbairn et al. |
| 10,904,996 B2 | 1/2021 | Koh et al. |
| 10,923,320 B2 | 2/2021 | Koh et al. |
| 10,923,321 B2 | 2/2021 | Dorf et al. |
| 10,923,367 B2 | 2/2021 | Lubomirsky et al. |
| 10,923,379 B2 | 2/2021 | Liu et al. |
| 10,978,274 B2 | 4/2021 | Kubota |
| 10,991,554 B2 | 4/2021 | Zhao et al. |
| 10,998,169 B2 | 5/2021 | Ventzek et al. |
| 11,011,349 B2 | 5/2021 | Brouk et al. |
| 11,095,280 B2 | 8/2021 | Ziemba et al. |
| 11,108,384 B2 | 8/2021 | Prager et al. |
| 2001/0003298 A1 | 6/2001 | Shamouilian et al. |
| 2001/0009139 A1 | 7/2001 | Shan et al. |
| 2001/0033755 A1 | 10/2001 | Ino et al. |
| 2002/0069971 A1 | 6/2002 | Kaji et al. |
| 2002/0078891 A1 | 6/2002 | Chu et al. |
| 2003/0026060 A1 | 2/2003 | Hiramatsu et al. |
| 2003/0029859 A1 | 2/2003 | Knoot et al. |
| 2003/0052085 A1 | 3/2003 | Parsons |

(56) References Cited

U.S. PATENT DOCUMENTS

| | | |
|---|---|---|
| 2003/0079983 A1 | 5/2003 | Long et al. |
| 2003/0091355 A1 | 5/2003 | Jeschonek et al. |
| 2003/0137791 A1 | 7/2003 | Arnet et al. |
| 2003/0151372 A1 | 8/2003 | Tsuchiya et al. |
| 2003/0165044 A1 | 9/2003 | Yamamoto |
| 2003/0201069 A1 | 10/2003 | Johnson |
| 2004/0040931 A1 | 3/2004 | Koshiishi et al. |
| 2004/0066601 A1 | 4/2004 | Larsen |
| 2004/0112536 A1 | 6/2004 | Quon |
| 2004/0223284 A1 | 11/2004 | Iwami et al. |
| 2005/0022933 A1 | 2/2005 | Howard |
| 2005/0039852 A1 | 2/2005 | Roche et al. |
| 2005/0092596 A1 | 5/2005 | Kouznetsov |
| 2005/0098118 A1 | 5/2005 | Amann et al. |
| 2005/0151544 A1 | 7/2005 | Mahoney et al. |
| 2005/0152159 A1 | 7/2005 | Isurin et al. |
| 2005/0286916 A1 | 12/2005 | Nakazato et al. |
| 2006/0075969 A1 | 4/2006 | Fischer |
| 2006/0130767 A1 | 6/2006 | Herchen |
| 2006/0139843 A1 | 6/2006 | Kim |
| 2006/0171848 A1 | 8/2006 | Roche et al. |
| 2006/0219178 A1 | 10/2006 | Asakura |
| 2006/0278521 A1 | 12/2006 | Stowell |
| 2007/0113787 A1 | 5/2007 | Higashiura et al. |
| 2007/0114981 A1 | 5/2007 | Vasquez et al. |
| 2007/0196977 A1 | 8/2007 | Wang et al. |
| 2007/0284344 A1 | 12/2007 | Todorov et al. |
| 2007/0285869 A1 | 12/2007 | Howald |
| 2008/0012548 A1 | 1/2008 | Gerhardt et al. |
| 2008/0037196 A1 | 2/2008 | Yonekura et al. |
| 2008/0106842 A1 | 5/2008 | Ito et al. |
| 2008/0135401 A1 | 6/2008 | Kadlec et al. |
| 2008/0160212 A1 | 7/2008 | Koo et al. |
| 2008/0185537 A1 | 8/2008 | Walther et al. |
| 2008/0210545 A1 | 9/2008 | Kouznetsov |
| 2008/0236493 A1 | 10/2008 | Sakao |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0016549 A1 | 1/2009 | French et al. |
| 2009/0059462 A1 | 3/2009 | Mizuno et al. |
| 2009/0078678 A1 | 3/2009 | Kojima et al. |
| 2009/0295295 A1 | 12/2009 | Shannon et al. |
| 2010/0018648 A1 | 1/2010 | Collins et al. |
| 2010/0025230 A1 | 2/2010 | Ehiasarian et al. |
| 2010/0118464 A1 | 5/2010 | Matsuyama |
| 2010/0130018 A1 | 5/2010 | Tokashiki et al. |
| 2010/0154994 A1 | 6/2010 | Fischer et al. |
| 2010/0193491 A1 | 8/2010 | Cho et al. |
| 2010/0271744 A1 | 10/2010 | Ni et al. |
| 2010/0326957 A1 | 12/2010 | Maeda et al. |
| 2011/0143537 A1 | 6/2011 | Lee et al. |
| 2011/0157760 A1 | 6/2011 | Willwerth et al. |
| 2011/0177669 A1 | 7/2011 | Lee et al. |
| 2011/0281438 A1 | 11/2011 | Lee et al. |
| 2011/0298376 A1 | 12/2011 | Kanegae et al. |
| 2012/0000421 A1 | 1/2012 | Miller et al. |
| 2012/0081350 A1 | 4/2012 | Sano et al. |
| 2012/0088371 A1 | 4/2012 | Ranjan et al. |
| 2012/0097908 A1 | 4/2012 | Willwerth et al. |
| 2013/0059448 A1 | 3/2013 | Marakhtanov et al. |
| 2013/0087447 A1 | 4/2013 | Bodke et al. |
| 2013/0213935 A1 | 8/2013 | Liao et al. |
| 2013/0214828 A1 | 8/2013 | Valcore, Jr. et al. |
| 2013/0340938 A1 | 12/2013 | Tappan et al. |
| 2013/0344702 A1 | 12/2013 | Nishizuka |
| 2014/0057447 A1 | 2/2014 | Yang et al. |
| 2014/0077611 A1 | 3/2014 | Young et al. |
| 2014/0109886 A1 | 4/2014 | Singleton et al. |
| 2014/0125315 A1 | 5/2014 | Kirchmeier et al. |
| 2014/0154819 A1 | 6/2014 | Gaff et al. |
| 2014/0177123 A1 | 6/2014 | Thach et al. |
| 2014/0263182 A1 | 9/2014 | Chen et al. |
| 2014/0349033 A1 | 11/2014 | Nonaka et al. |
| 2015/0002018 A1 | 1/2015 | Lill et al. |
| 2015/0084509 A1 | 3/2015 | Yuzurihara et al. |
| 2015/0111394 A1 | 4/2015 | Hsu et al. |
| 2015/0116889 A1 | 4/2015 | Yamasaki et al. |
| 2015/0170952 A1 | 6/2015 | Subramani et al. |
| 2015/0235809 A1 | 8/2015 | to et al. |
| 2015/0366004 A1 | 12/2015 | Nangoy et al. |
| 2016/0004475 A1 | 1/2016 | Beniyama et al. |
| 2016/0027678 A1 | 1/2016 | Parkhe et al. |
| 2016/0056017 A1 | 2/2016 | Kim et al. |
| 2016/0064189 A1 | 3/2016 | Tandou et al. |
| 2016/0196958 A1 | 7/2016 | Leray et al. |
| 2016/0241234 A1 | 8/2016 | Mavretic |
| 2016/0284514 A1 | 9/2016 | Hirano et al. |
| 2016/0322242 A1 | 11/2016 | Nguyen et al. |
| 2016/0327029 A1 | 11/2016 | Ziemba et al. |
| 2016/0351375 A1 | 12/2016 | Valcore, Jr. et al. |
| 2017/0011887 A1* | 1/2017 | Deshmukh ........ H01J 37/32431 |
| 2017/0018411 A1 | 1/2017 | Sriraman et al. |
| 2017/0029937 A1 | 2/2017 | Chistyakov et al. |
| 2017/0069462 A1 | 3/2017 | Kanarik et al. |
| 2017/0076962 A1 | 3/2017 | Engelhardt |
| 2017/0098527 A1 | 4/2017 | Kawasaki et al. |
| 2017/0098549 A1 | 4/2017 | Agarwal |
| 2017/0110335 A1 | 4/2017 | Yang et al. |
| 2017/0162417 A1 | 6/2017 | Ye et al. |
| 2017/0169996 A1 | 6/2017 | Ui et al. |
| 2017/0170449 A1 | 6/2017 | Alexander et al. |
| 2017/0178917 A1 | 6/2017 | Kamp et al. |
| 2017/0221682 A1 | 8/2017 | Nishimura et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0250056 A1 | 8/2017 | Boswell et al. |
| 2017/0263478 A1 | 9/2017 | McChesney et al. |
| 2017/0278665 A1 | 9/2017 | Carter et al. |
| 2017/0311431 A1 | 10/2017 | Park |
| 2017/0316935 A1 | 11/2017 | Tan et al. |
| 2017/0330734 A1 | 11/2017 | Lee et al. |
| 2017/0358431 A1 | 12/2017 | Dorf et al. |
| 2017/0372912 A1 | 12/2017 | Long et al. |
| 2018/0076032 A1 | 3/2018 | Wang et al. |
| 2018/0139834 A1 | 5/2018 | Nagashima et al. |
| 2018/0190501 A1 | 7/2018 | Ueda |
| 2018/0204708 A1 | 7/2018 | Tan et al. |
| 2018/0218905 A1 | 8/2018 | Park et al. |
| 2018/0294566 A1 | 10/2018 | Wang et al. |
| 2018/0309423 A1 | 10/2018 | Okunishi et al. |
| 2018/0350649 A1 | 12/2018 | Gomm |
| 2018/0366305 A1 | 12/2018 | Nagami et al. |
| 2018/0374672 A1 | 12/2018 | Hayashi et al. |
| 2019/0027344 A1 | 1/2019 | Okunishi et al. |
| 2019/0096633 A1 | 3/2019 | Pankratz et al. |
| 2019/0157040 A1* | 5/2019 | Fairbairn ................ C23C 14/48 |
| 2019/0172688 A1 | 6/2019 | Ueda |
| 2019/0198333 A1 | 6/2019 | Tokashiki |
| 2019/0267218 A1 | 8/2019 | Wang et al. |
| 2019/0277804 A1 | 9/2019 | Prager et al. |
| 2019/0295769 A1 | 9/2019 | Prager et al. |
| 2019/0295819 A1 | 9/2019 | Okunishi et al. |
| 2019/0318918 A1 | 10/2019 | Saitoh et al. |
| 2019/0333741 A1 | 10/2019 | Nagami et al. |
| 2019/0341232 A1 | 11/2019 | Thokachichu et al. |
| 2019/0348263 A1 | 11/2019 | Okunishi |
| 2019/0363388 A1 | 11/2019 | Esswein et al. |
| 2019/0385822 A1 | 12/2019 | Marakhtanov et al. |
| 2020/0016109 A1 | 1/2020 | Feng et al. |
| 2020/0020510 A1 | 1/2020 | Shoeb et al. |
| 2020/0024330 A1 | 1/2020 | Chan-Hui et al. |
| 2020/0058475 A1 | 2/2020 | Engelstaedter et al. |
| 2020/0066497 A1 | 2/2020 | Engelstaedter et al. |
| 2020/0075290 A1* | 3/2020 | Kawasaki ......... H01J 37/32146 |
| 2020/0075293 A1 | 3/2020 | Ventzek et al. |
| 2020/0090905 A1 | 3/2020 | Brouk et al. |
| 2020/0106137 A1 | 4/2020 | Murphy et al. |
| 2020/0126837 A1 | 4/2020 | Kuno et al. |
| 2020/0161098 A1 | 5/2020 | Cui et al. |
| 2020/0161155 A1 | 5/2020 | Rogers et al. |
| 2020/0243303 A1 | 7/2020 | Mishra et al. |
| 2020/0251371 A1 | 8/2020 | Kuno et al. |

(56) References Cited

U.S. PATENT DOCUMENTS

| | | |
|---|---|---|
| 2020/0266022 A1 | 8/2020 | Dorf et al. |
| 2020/0266035 A1 | 8/2020 | Nagaiwa |
| 2020/0286714 A1 | 9/2020 | Kubota |
| 2020/0294770 A1 | 9/2020 | Kubota |
| 2020/0352017 A1 | 11/2020 | Dorf et al. |
| 2020/0373114 A1 | 11/2020 | Prager et al. |
| 2020/0389126 A1 | 12/2020 | Prager et al. |
| 2020/0407840 A1 | 12/2020 | Hayashi et al. |
| 2020/0411286 A1 | 12/2020 | Koshimizu et al. |
| 2021/0013006 A1 | 1/2021 | Nguyen et al. |
| 2021/0043472 A1 | 2/2021 | Koshimizu et al. |
| 2021/0051792 A1 | 2/2021 | Dokan et al. |
| 2021/0082669 A1 | 3/2021 | Koshiishi et al. |
| 2021/0130955 A1 | 5/2021 | Nagaike et al. |
| 2021/0140044 A1 | 5/2021 | Nagaike et al. |
| 2021/0210313 A1 | 7/2021 | Ziemba et al. |
| 2021/0272775 A1 | 9/2021 | Koshimizu |
| 2021/0288582 A1 | 9/2021 | Ziemba et al. |

FOREIGN PATENT DOCUMENTS

| | | |
|---|---|---|
| CN | 101990353 B | 4/2013 |
| CN | 104752134 B | 2/2017 |
| EP | 983394 A1 | 3/2000 |
| EP | 1119033 A1 | 7/2001 |
| EP | 1214459 A1 | 6/2002 |
| EP | 1418670 A1 | 5/2004 |
| EP | 1214459 B1 | 7/2006 |
| EP | 1691481 A1 | 8/2006 |
| EP | 1708239 A1 | 10/2006 |
| EP | 2096679 A1 | 9/2009 |
| EP | 2541584 A1 | 1/2013 |
| EP | 2580368 A1 | 4/2013 |
| EP | 2838112 A1 | 2/2015 |
| EP | 3086359 A1 | 10/2016 |
| EP | 3616234 A1 | 3/2020 |
| JP | S5018244 A | 2/1975 |
| JP | 2748213 B2 | 5/1998 |
| JP | 4418424 B2 | 2/2010 |
| JP | 5018244 A2 | 9/2012 |
| JP | 5018244 B2 | 9/2012 |
| JP | Y5018244 | 9/2012 |
| JP | 2014112644 A | 6/2014 |
| JP | 06741461 | 8/2020 |
| JP | 2021503700 A | 2/2021 |
| JP | 2021077865 A | 5/2021 |
| KR | 757347 B1 | 9/2007 |
| KR | 20160042429 A | 4/2016 |
| KR | 20200100641 A | 8/2020 |
| TW | 201440141 A | 10/2014 |
| TW | 201448030 A | 12/2014 |
| TW | 201717247 A | 5/2017 |
| TW | 202006818 A | 2/2020 |
| WO | 2002059954 A1 | 8/2002 |
| WO | 2008050619 A1 | 5/2008 |
| WO | 2011087984 A3 | 11/2011 |
| WO | 2014197145 A1 | 12/2014 |
| WO | 2014124857 A3 | 5/2015 |
| WO | 2015198854 A1 | 12/2015 |
| WO | 2016002547 A1 | 1/2016 |
| WO | 2019036587 A1 | 2/2019 |
| WO | 2019185423 A1 | 10/2019 |
| WO | 2019225184 A1 | 11/2019 |
| WO | 2019239872 A1 | 12/2019 |
| WO | 2019245729 A1 | 12/2019 |
| WO | 2020004048 A1 | 1/2020 |
| WO | 2020017328 A1 | 1/2020 |
| WO | 2020051064 A1 | 3/2020 |
| WO | 2020121819 A1 | 6/2020 |
| WO | 2021097459 A1 | 5/2021 |
| WO | 2021118862 A2 | 6/2021 |

OTHER PUBLICATIONS

Taiwan Office Action issued patent applicatio No. 111144515 on Nov. 21, 2024.
Korean Office Action issued to patent application No. 10-2024-7018591 on Jan. 15, 2025.
Taiwan Office Action issued to patent application No. 111144515 on Jun. 19, 2025.
Chang, Bingdong, "Oblique angled plasma etching for 3D silicon structures with wiggling geometries" 31(8), [085301]. https://doi.org/10.1088/1361-6528/ab53fb. DTU Library. 2019, 10 pages.
Dr. Steve Sirard, "Introduction to Plasma Etching", Lam Research Corporation. 64 pages.
Eagle Harbor Technologies presentation by Dr. Kenneth E. Miller—"The EHT Integrated Power Module (IPM): An IGBT-Based, High Current, Ultra-Fast, Modular, Programmable Power Supply Unit," Jun. 2013, 21 pages.
Eagle Harbor Technologies presentation by Dr. Kenneth E. Miller—"The EHT Long Pulse Integrator Program," ITPA Diagnostic Meeting, General Atomics, Jun. 4-7, 2013, 18 pages.
Eagle Harbor Technologies webpage—"EHT Integrator Demonstration at DIII-D," 2015, 1 page.
Eagle Harbor Technologies webpage—"High Gain and Frequency Ultra-Stable Integrators for ICC and Long Pulse ITER Applications," 2012, 1 page.
Eagle Harbor Technologies webpage—High Gain and Frequency Ultra-Stable Integrators for Long Pulse and/or High Current Applications, 2018, 1 page.
Eagle Harbor Technologies webpage—"In Situ Testing of EHT Integrators on a Tokamak," 2015, 1 page.
Eagle Harbor Technologies webpage—"Long-Pulse Integrator Testing with DIII-D Magnetic Diagnostics," 2016, 1 page.
Electrical 4 U webpage—"Clamping Circuit," Aug. 29, 2018, 9 pages.
Kamada, Keiichi, et al., Editors—"New Developments of Plasma Science with Pulsed Power Technology," Research Report, NIFS-PROC-82, presented at National Institute for Fusion Science, Toki, Gifu, Japan, Mar. 5-6, 2009, 109 pages.
Kyung Chae Yang et al., A study on the etching characteristics of magnetic tunneling junction materials using DC pulse-biased inductively coupled plasmas, Japanese Journal of Applied Physics, vol. 54, 01AE01, Oct. 29, 2014, 6 pages.
Lin, Jianliang, et al.,—"Diamond like carbon films deposited by HiPIMS using oscillatory voltage pulses," Surface & Coatings Technology 258, 2014, published by Elsevier B.V., pp. 1212-1222.
Michael A. Lieberman, "A short course of the principles of plasma discharges and materials processing", Department of Electrical Engineering and Computer Sciences University of California, Berkeley, CA 94720, 122 pages.
Michael A. Lieberman, "Principles of Plasma Discharges and Material Processing", A Wiley Interscience Publication. 1994, 100 pages.
Prager, J.R., et al.—"A High Voltage Nanosecond Pulser with Variable Pulse Width and Pulse Repetition Frequency Control for Nonequilibrium Plasma Applications," IEEE 41st International Conference on Plasma Sciences (ICOPS) held with 2014 IEEE International Conference on High-Power Particle Beams (BEAMS), pp. 1-6, 2014.
Richard Barnett et al. A New Plasma Source for Next Generation MEMS Deep Si Etching: Minimal Tilt, Improved Profile Uniformity and Higher Etch Rates, SPP Process Technology Systems. 2010, 4 pages.
S.B. Wang et al. "Ion Bombardment Energy and SiO $_2$/Si Fluorocarbon Plasma Etch Selectivity", Journal of Vacuum Science & Technology A 19, 2425 (2001), 4 pages.
Wang, S.B., et al.—"Control of ion energy distribution at substrates during plasma processing," Journal of Applied Physics, vol. 88, No. 2, Jul. 15, 2000, pp. 643-646.
Yiting Zhang et al. "Investigation of feature orientation and consequences of ion tilting during plasma etching with a three-dimensional feature profile simulator", Nov. 22, 2016, 16 pages.
Zhen-hua Bi et al., A brief review of dual-frequency capacitively coupled discharges, Current Applied Physics, vol. 11, Issue 5, Supplement, 2011, pp. S2-S8.

(56) References Cited

OTHER PUBLICATIONS

Zhuoxing Luo, B.S., M.S, "RF Plasma Etching With A DC Bias" A Dissertation in Physics. Dec. 1994, 135 pages.
International Search Report dated Feb. 27, 2023 for Application No. PCT/US2022/047677.

* cited by examiner

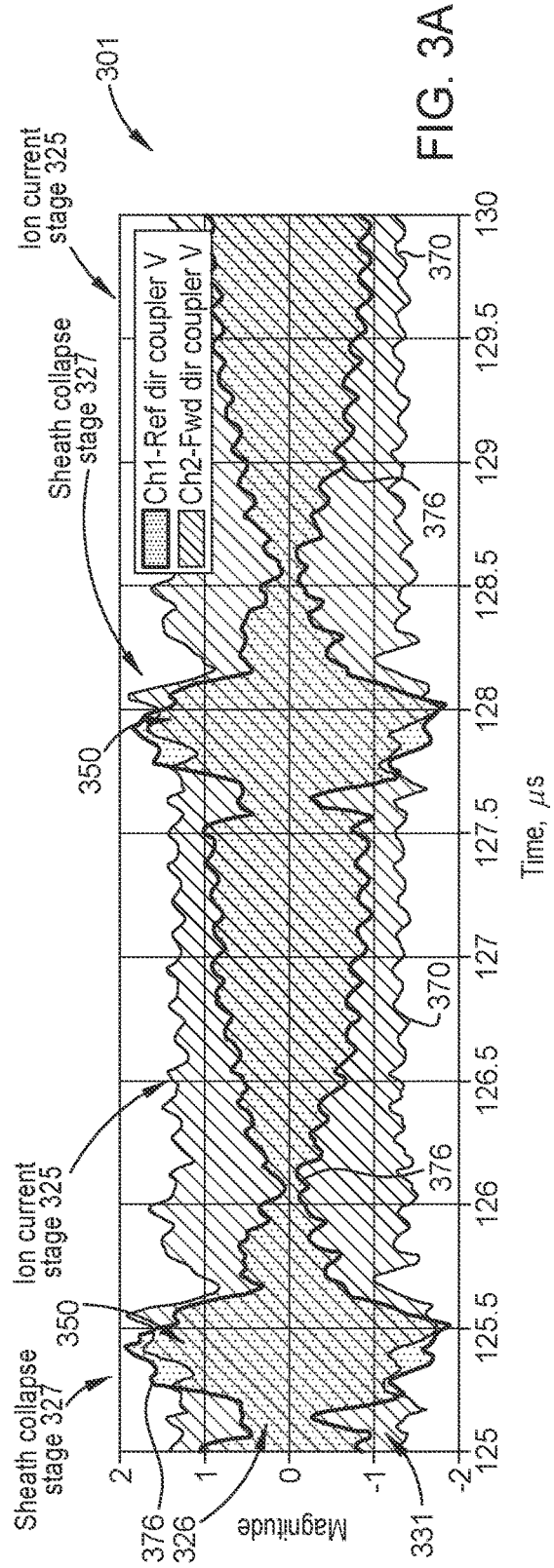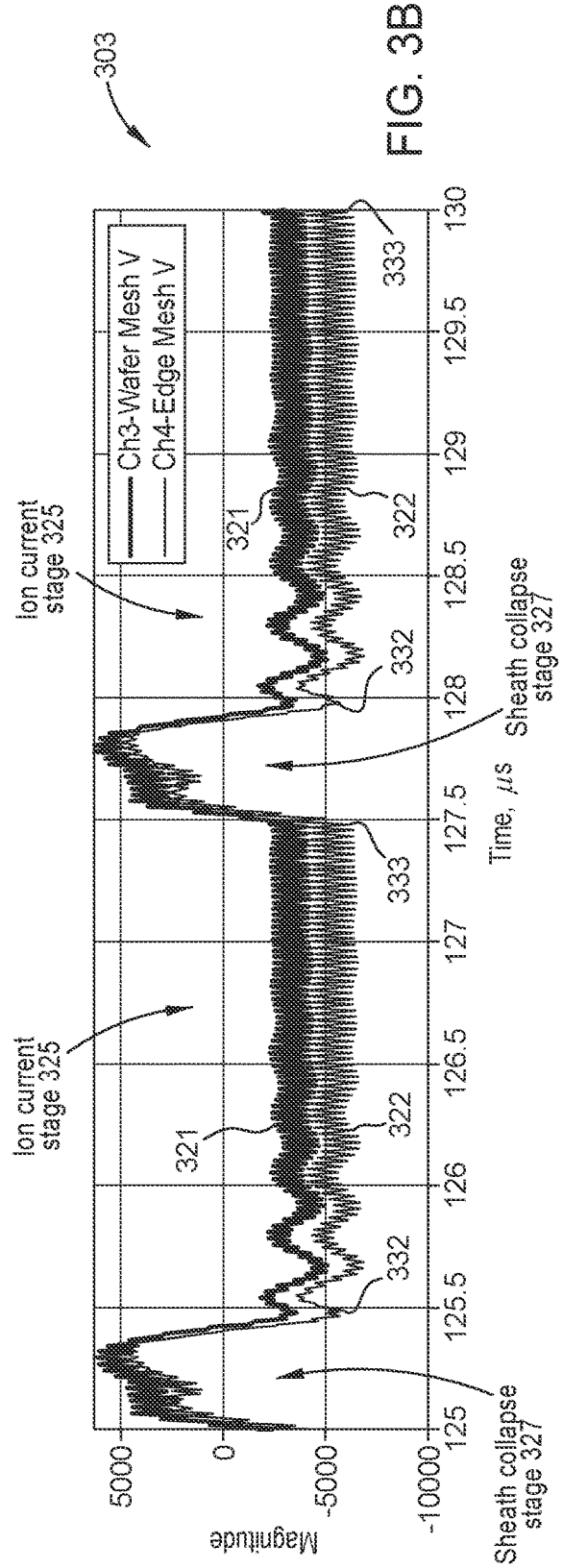

APPARATUS AND METHOD FOR DELIVERING A PLURALITY OF WAVEFORM SIGNALS DURING PLASMA PROCESSING

CROSS-REFERENCE TO RELATED APPLICATIONS

This application is a divisional of U.S. application Ser. No. 17/884,423, filed Aug. 9, 2022, which claims the benefit of and priority to U.S. Provisional Patent Application No. 63/287,433, filed Dec. 8, 2021, which is herein incorporated by reference.

BACKGROUND

Field

Embodiments of the present disclosure generally relate to a system and methods used in semiconductor device manufacturing. More specifically, embodiments provided herein generally include a system and methods for synchronizing a radio frequency (RF) pulsed waveform with a pulsed voltage (PV) waveform to one or more electrodes within a processing chamber.

Description of the Related Art

Reliably producing high aspect ratio features is one of the key technology challenges for the next generation of semiconductor devices. One method of forming high aspect ratio features uses a plasma assisted etching process, such as a reactive ion etch (RIE) plasma process, to form high aspect ratio openings in a material layer, such as a dielectric layer, of a substrate. In a typical RIE plasma process, a plasma is formed in a processing chamber and ions from the plasma are accelerated towards a surface of a substrate to form openings in a material layer disposed beneath a mask layer formed on the surface of the substrate.

A typical Reactive Ion Etch (RIE) plasma processing chamber includes a radio frequency (RF) bias generator, which supplies an RF voltage to a power electrode. In a capacitively coupled gas discharge, the plasma is created by using a radio frequency (RF) generator that is coupled to the power electrode that is disposed within an electrostatic chuck (ESC) assembly or within another portion of the processing chamber. Typically, an RF matching network ("RF match") tunes an RF waveform provided from an RF generator to deliver RF power to an apparent load of 50 Ω to minimize the reflected power and maximize the power delivery efficiency. If the impedance of the load is not properly matched to impedance of the source (e.g., the RF generator), a portion of the forward delivered RF waveform can reflect back in the opposite direction along the same transmission line.

A number of plasma processes also utilize DC voltage pulsing schemes to control the plasma sheath disposed over the substrate that is being processed. During operation, the DC voltage pulses cause a generated plasma sheath to toggle between states that includes a thick plasma sheath and state where no plasma sheath exists. Typical, DC pulsing techniques are configured to deliver voltage pulses at a frequency greater than 50 kHz, such as greater than 400 kHz. The toggling of the plasma sheath due to the delivery DC pulsed voltage waveform results in the plasma load having different impedance values over time. It has been found that due to the interaction between the RF waveform and DC pulsed voltage waveform that are simultaneously provided during plasma processing can lead differing plasma processing results due in large part to the RF matching portion of the of the RF power delivery system's inability to adjust the RF matching point to account for the rapidly changing plasma load impedance values over time. Conventional impedance matching components and matching processes are unable to keep up with the rapid changes in magnitude of the plasma load impedance, thus causing the match to find undesirable matching points that typically leads to the generation of varying amounts of RF power that are actually delivered to the plasma load due to 1) inter-modulation distortion (IMD) of the RF signal, and 2) undesirably high reflected RF powers found at harmonics of the driven RF frequency. The inter-modulation distortion created by the interaction between the RF and DC pulsed voltage waveforms causes the amplitude of at least the RF signal to vary over time. The interaction or intermodulation between the RF and DC pulsed voltage waveforms causes additional undesirable waveform components to form at frequencies that are not just at harmonic frequencies (i.e., integer multiples) of the interacting signals, such as either of the RF or DC pulsed waveforms. The generation of the IMD components in a power delivery system will reduce the actual forward RF power that is delivered to the plasma load. Due at least to unavoidable differences in processing chamber power delivery configurations and differences in the power delivery components, the rapidly changing plasma load impedance values cause undesirable differences in the plasma processing results seen in a single plasma processing chamber, seen in similarly configured processing chambers on a single processing system, and also seen in similarly configured plasma processing chambers within different plasma processing systems within a semiconductor fabrication site. Moreover, the generated IMD components are also not easily accounted for in most power delivery systems due to the broad range of frequencies that can develop during plasma processing in the same or different processing chambers and thus will cause unexpected variations in the power actually delivered to the plasma load during plasma processing.

Thus, there is a need in the art for plasma processing devices and biasing methods that are at least able to resolve these issues outlined above.

SUMMARY

The present disclosure generally relates to a method for plasma processing comprising applying a voltage waveform to an electrode disposed in a substrate support, the voltage waveform having a first stage and a second stage, wherein the first stage includes a sheath collapse stage, and the second stage includes an ion current stage. The method further includes applying a pulsed radio frequency (RF) waveform to a reactive species to generate a plasma in a processing region of a processing chamber, and synchronizing the pulsed RF waveform to the voltage waveform such that the pulsed RF waveform is provided during one of the stages and not the other stage. In one embodiment, the pulsed RF waveform is provided during the second stage and not the first stage. In another embodiment, the pulsed RF waveform is provided during the first stage and not the second stage.

The present disclosure generally relates to a method for plasma processing comprising applying a voltage waveform to an electrode disposed in a substrate support, the voltage waveform having a first stage and a second stage, wherein the first stage includes a sheath collapse stage, and the second stage includes an ion current stage. The method further includes applying a pulsed radio frequency (RF) waveform to a reactive species to generate a plasma in a processing region of a processing chamber, and synchronizing the pulsed RF waveform to the voltage waveform such that the pulsed RF waveform is provided during one stage and not the other stage.

The present disclosure further includes a plasma processing system comprising a PV waveform generator coupled to a first electrode, a RF waveform generator coupled to a second electrode of the plasma processing system, wherein the RF waveform generator is configured to generate a plasma within the processing region, an impedance matching circuit, and a controller having a processor configured to execute computer readable instructions that cause the system to apply a PV waveform generated by the PV waveform generator, apply a RF waveform generated by the RF waveform generator and synchronize the PV waveform to the RF waveform.

Embodiments of the disclosure provide a method for plasma processing comprising applying a pulsed voltage waveform to one or more electrodes disposed in a substrate support, the voltage waveform having a first stage and a second stage, applying a pulsed radio frequency (RF) waveform to the one or more electrodes to generate a plasma in a processing region of a processing chamber, and synchronizing the pulsed RF waveform with each pulse of the pulsed voltage waveform, such that an RF waveform of the pulsed radio frequency (RF) waveform is provided only during at least a portion of the second stage of each pulse of the pulsed voltage waveform.

Embodiments of the disclosure provide a method for plasma processing comprising applying a pulsed voltage waveform to one or more electrodes disposed in a substrate support, the voltage waveform having a first stage and a second stage, applying a pulsed radio frequency (RF) waveform to the one or more electrodes to generate a plasma in a processing region of a processing chamber, and synchronizing the pulsed RF waveform with each pulse of the pulsed voltage waveform, such that an RF waveform of the pulsed radio frequency (RF) waveform is provided only during at least a portion of the first stage of each pulse of the pulsed voltage waveform.

Embodiments of the disclosure provide a plasma processing system, comprising a pulsed voltage waveform generator coupled to a first electrode; a radio frequency waveform generator coupled to a second electrode, wherein the radio frequency waveform generator is configured to generate a plasma within a processing volume of the plasma processing system; an impedance matching circuit coupled between the radio frequency waveform generator and the second electrode; and a controller. The controller having a processor configured to execute computer-readable instructions stored within memory that cause the system to: apply, by use of the pulsed voltage waveform generator, a pulsed voltage waveform to the first electrode, the pulsed voltage waveform comprising a series of voltage pulses that each comprise a first stage and a second stage; apply, by use of the radio frequency waveform generator, a pulsed radio frequency waveform to the second electrode to generate a plasma in a processing region of a processing chamber; and synchronize the pulsed RF waveform with each pulse of the pulsed voltage waveform, such that an RF waveform of the pulsed radio frequency (RF) waveform is provided only during at least a portion of the second stage of each pulse of the pulsed voltage waveform.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 3A is a plot of a forward RF bias voltage signal and an inter-modulation distortion (IMD) signal measured along a transmission line that is coupled to the one or more electrodes of the processing chamber, according to one embodiment.

FIG. 3B illustrates an RF bias voltage signal impressed on a pulsed voltage waveform delivered through the transmission line that is coupled to the one or more electrodes of the processing chamber, according to one embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a system used in a semiconductor device manufacturing process. More specifically, embodiments provided herein generally include apparatus and methods for synchronizing and controlling the delivery of an RF bias voltage signal and a pulsed voltage waveform to one or more electrodes within a plasma processing chamber.

Figure 1:
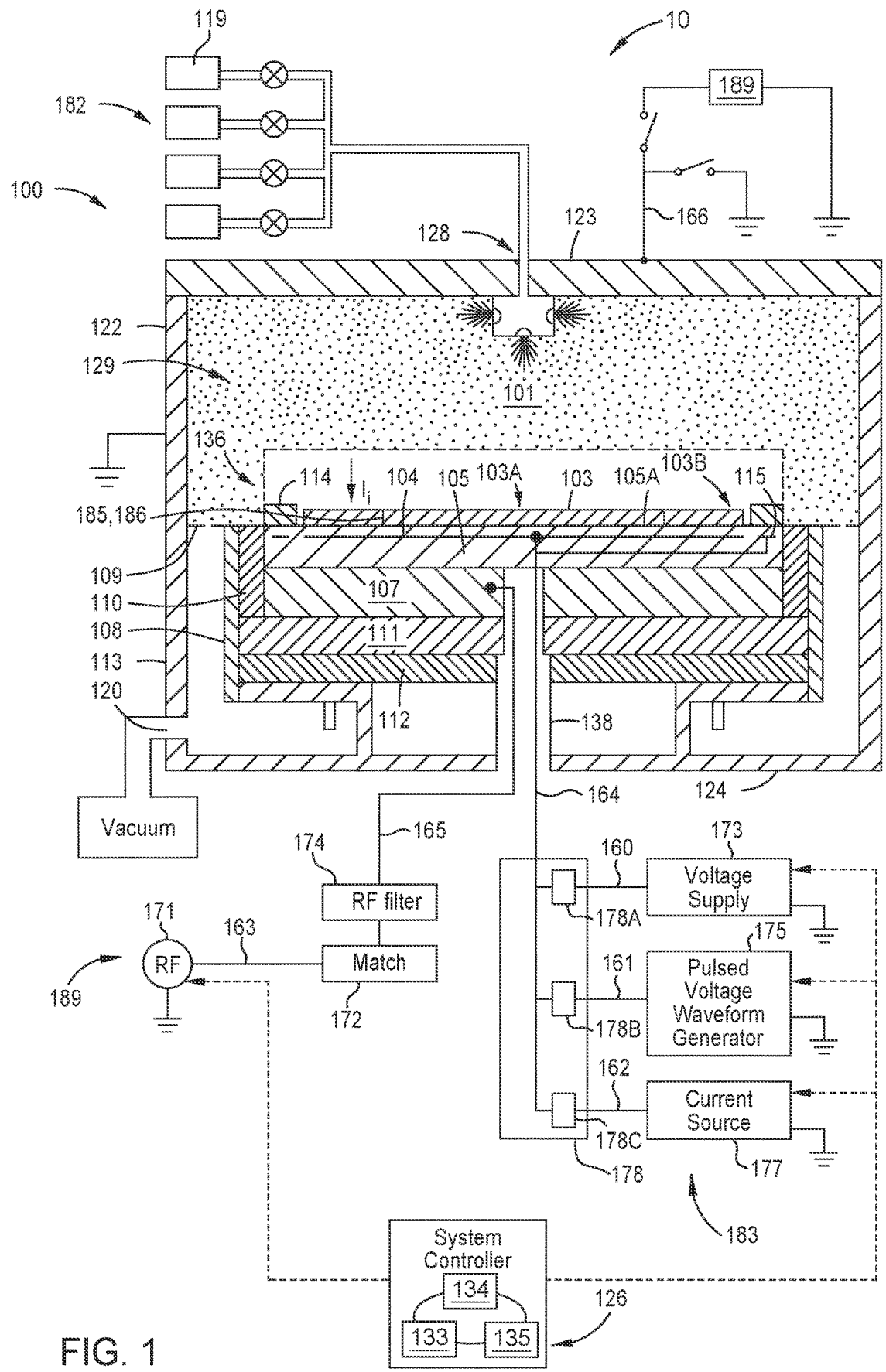
FIG. 1 is a schematic cross-sectional view of a processing system, according to one or more embodiments, configured to practice the methods set forth herein.

FIG. 1 is a schematic cross-sectional view of a plasma processing chamber assembly 10 configured to perform one or more of the plasma processing methods set forth herein. In some embodiments, the plasma processing chamber assembly 10 is configured for plasma-assisted etching processes, such as a reactive ion etch (RIE) plasma processing. The plasma processing chamber assembly 10 can also be used in other plasma-assisted processes, such as plasma-enhanced deposition processes (for example, plasma-enhanced chemical vapor deposition (PECVD) processes, plasma-enhanced physical vapor deposition (PEPVD) processes, plasma-enhanced atomic layer deposition (PEALD) processes, plasma treatment processing, plasma-based ion implant processing, or plasma doping (PLAD) processing. In one configuration, as shown in FIG. 1, the plasma processing chamber assembly 10 is configured to form a capacitively coupled plasma (CPP). However, in some embodiments, a plasma may alternately be generated by an inductively coupled source disposed over the processing region of the plasma processing chamber assembly 10. In this configuration, a coil may be placed on top of a ceramic lid (vacuum boundary) of the plasma processing chamber assembly 10.

The plasma processing chamber assembly 10 includes a processing chamber 100, a substrate support assembly 136, a gas delivery system 182, a DC power system 183, an RF power system 189, and a system controller 126. The processing chamber 100 includes a chamber body 113 that comprises a chamber lid 123, one or more sidewalls 122, and a chamber base 124. The chamber lid 123, one or more sidewalls 122, and the chamber base 124 collectively define the processing volume 129. The one or more sidewalls 122 and chamber base 124 generally include materials (such as aluminum, aluminum alloys, or stainless steel alloys) that are sized and shaped to form the structural support for the elements of the processing chamber 100 and are configured to withstand the pressures and added energy applied to them while a plasma 101 is generated within a vacuum environment maintained in the processing volume 129 of the processing chamber 100 during processing. A substrate 103 is loaded into, and removed from, the processing volume 129 through an opening (not shown) in one of the sidewalls 122. The opening is sealed with a slit valve (not shown) during plasma processing of the substrate 103. A gas delivery system 182, which is coupled to the processing volume 129 of the processing chamber 100, includes a processing gas source 119 and a gas inlet 128 disposed through the chamber lid 123. The gas inlet 128 is configured to deliver one or more processing gases to the processing volume 129 from the plurality of processing gas sources 119.

The processing chamber 100 further includes an upper electrode (e.g., a chamber lid 123) and a lower electrode (e.g., a substrate support assembly 136) disposed in a processing volume 129. The upper electrode and lower electrode are positioned to face each other. As seen in FIG. 1, in one embodiment, a radio frequency (RF) source (e.g., RF power system 189) is electrically coupled to the lower electrode. The RF source is configured to deliver an RF signal to ignite and maintain a plasma (e.g., the plasma 101) between the upper and lower electrodes. In some alternative configurations, the RF source (e.g., RF power system 189) can also be electrically coupled to the upper electrode as shown in FIG. 1.

The substrate support assembly 136 includes a substrate support 105, a substrate support base 107, an insulator plate 111, a ground plate 112, a plurality of lift pins 186, one or more substrate potential sensing assemblies 184, and a bias electrode 104. Each of the lift pins 186 are disposed through a through hole 185 formed in the substrate support assembly 136 and are used to facilitate the transfer of a substrate 103 to and from a substrate receiving surface 105A of the substrate support 105. The substrate support 105 is formed of a dielectric material. The dielectric material can include a bulk sintered ceramic material, a corrosion-resistant metal oxide (for example, aluminum oxide ($Al_2O_3$), titanium oxide (TiO), yttrium oxide ($Y_2O_3$), a metal nitride material (for example, aluminum nitride (AlN), titanium nitride (TiN)), mixtures thereof, or combinations thereof.

The substrate support base 107 is formed of a conductive material (for example aluminum, an aluminum alloy, or a stainless steel alloy). The substrate support base 107 is electrically isolated from the chamber base 124 by the insulator plate 111, and the ground plate 112 interposed between the insulator plate 111 and the chamber base 124. In some embodiments, the substrate support base 107 is configured to regulate the temperature of both the substrate support 105, and the substrate 103 disposed on the substrate support 105 during substrate processing. In some embodiments, the substrate support base 107 includes one or more cooling channels (not shown) disposed therein that are fluidly coupled to, and in fluid communication with, a coolant source (not shown), such as a refrigerant source or substrate source having a relatively high electrical resistance. In other embodiments, the substrate support 105 includes a heater (not shown) to heat the substrate support 105 and substrate 103 disposed on the substrate support 105.

A bias electrode 104 is embedded in the dielectric material of the substrate support 105. Typically, the bias electrode 104 is formed of one or more electrically conductive parts. The electrically conductive parts typically include meshes, foils, plates, or combinations thereof. Here, the bias electrode 104 functions as a chucking pole (i.e., electrostatic chucking electrode) that is used to secure (e.g., electrostatically chuck) the substrate 103 to the substrate receiving surface 105A of the substrate support 105. In general, a parallel plate like structure is formed by the bias electrode 104 and a layer of the dielectric material that is disposed between the bias electrode 104 and the substrate receiving surface 105A. The dielectric material can typically have an effective capacitance CE of between about 5 nF and about 50 nF. Typically, the layer of dielectric material (e.g., aluminum nitride (AlN), aluminum oxide ($Al_2O_3$), etc.) has a thickness between about 0.03 mm and about 5 mm, such as between about 0.1 mm and about 3 mm, such as between about 0.1 mm and about 1 mm, or even between about 0.1 mm and 0.5 mm. The bias electrode 104 is electrically coupled to a clamping network, which provides a chucking voltage thereto. The clamping network includes a DC voltage supply 173 (e.g., a high voltage DC supply) that is coupled to a filter 178A of the filter assembly 178 that is disposed between the DC voltage supply 173 and bias electrode 104. In one example, the filter 178A is a low-pass filter that is configured to block RF frequency and pulsed voltage (PV) waveform signals provided by other biasing components found within the processing chamber 100 from reaching the DC voltage supply 173 during plasma processing. In one configuration, the static DC voltage is between about −5000V and about 5000V, and is delivered using an electrical conductor (such as a coaxial power delivery line 160). In some embodiments, the bias electrode 104 can also bias the substrate 103 with the respect to the plasma 101 using one or more of the pulsed-voltage biasing schemes described in further detail below.

In some configurations, the substrate support assembly 136, further includes an edge control electrode 115. The edge control electrode 115 is formed of one or more electrically conductive parts. The electrically conductive parts typically include meshes, foils, plates, or combinations thereof. The edge control electrode 115 is positioned below the edge ring 114 and surrounds the bias electrode 104 and/or is disposed a distance from a center of the bias electrode 104. In general, for a processing chamber 100 that is configured to process circular substrates, the edge control electrode 115 is annular in shape, is made from a conductive material, and is configured to surround at least a portion of the bias electrode 104. In one configuration, when viewing the substrate supporting surface of the substrate support assembly 136 in a plan view, the bias electrode 104 is surrounded by or circumscribed by the edge control electrode 115, and is not in direct electrical contact with the edge control electrode 115. As seen in FIG. 1, the edge control electrode 115 is positioned within a region of the substrate support 105, and is biased by use of a pulsed voltage (PV) waveform generator 175. In one configuration, as schematically shown in FIG. 1, the edge control electrode 115 is biased by splitting part of the signal provided from the PV waveform generator 175 to the bias electrode 104. In another configuration, the edge control electrode 115 is coupled to and biased by use of a PV waveform generator 175 (not shown in FIG. 1) that is different from the PV waveform generator 175 used to bias electrode 104. In this configuration, the voltage waveform signals provided from the PV waveform generators 175 can be separately adjusted, and thus have different waveform characteristics, while also being synchronized by use of a synchronization signal provided from the system controller 126, or one of the RF or PV waveform generators, to allow the RF waveform to be provided during the same stage within the synchronized PV waveform pulses provided by each of the PV waveform generators 175.

The DC power system 183 includes the DC voltage supply 173, the PV waveform generator 175, and a current source 177. The RF power system 189 includes a radio frequency (RF) waveform generator 171, impedance matching circuit 172, and a RF filter 174. In one example, as shown in FIG. 1, a power delivery line 163 electrically connects the output of the RF waveform generator 171 to an impedance matching circuit 172, an RF filter 174 and substrate support base 107. As previously mentioned, during plasma processing, the DC voltage supply 173 provides a constant chucking voltage, while the RF waveform generator 171 delivers an RF signal to the processing region, and the PV waveform generator 175 establishes a PV waveform at the bias electrode 104. Applying a sufficient amount of RF power to an RF bias voltage signal, which is also referred to herein as a RF waveform, is provided to an electrode (e.g., substrate support base 107) so as to cause the plasma 101 to be formed in the processing volume 129 of the processing chamber 100. In one configuration, the RF waveform has a frequency range between about 1 MHz and about 200 MHz, such as between 2 MHz and 40 MHz.

In some embodiments, the DC power system 183 further includes a filter assembly 178 to electrically isolate one or more of the components contained within the DC power system 183. Power delivery line 160 electrically connects the output of the DC voltage supply 173 to a filter assembly 178. Power delivery line 161 electrically connects the output of the PV waveform generator 175 to the filter assembly 178. Power delivery line 162 connects the output of the current source 177 to the filter assembly 178. In some embodiments, the current source 177 is selectively coupled to the bias electrode 104 by use of a switch (not shown) disposed in the power delivery line 162, so as to allow the current source 177 to deliver a desired current to the bias electrode 104 during one or more stages (e.g., ion current stage) of the voltage waveform generated by the PV waveform generator 175. As seen in FIG. 1, the filter assembly 178, includes multiple separate filtering components (i.e., discrete filters 178A-178C) that are each electrically coupled to the output node via power delivery line 164. In an alternative configuration, the filter assembly 178 includes one common filter electrically coupled to the output node via power delivery line 164. The power delivery lines 160-164 include electrical conductors that include a combination of coaxial cables, such as a flexible coaxial cable that is connected in series with a rigid coaxial cable, an insulated high-voltage corona-resistant hookup wire, a bare wire, a metal rod, an electrical connector, of any combination of the above.

The system controller 126, also referred to herein as a processing chamber controller, includes a central processing unit (CPU) 133, a memory 134, and support circuits 135. The system controller 126 is used to control the process sequence used to process the substrate 103. The CPU is a general-purpose computer processor configured for use in an industrial setting for controlling the processing chamber and sub-processors related thereto. The memory 134 described herein, which is generally non-volatile memory, can include random access memory, read-only memory, hard disk drive, or other suitable forms of digital storage, local or remote. The support circuits 135 are conventionally coupled to the CPU 133 and comprises cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the plasma processing chamber assembly 10.

Typically, the program, which is readable by the CPU 133 in the system controller 126 includes code, which, when executed by the CPU 133, performs tasks relating to the plasma processing schemes described herein. The program may include instructions that are used to control the various hardware and electrical components within the plasma processing chamber assembly 10 to perform the various process tasks and various process sequences used to implement the methods described herein. In one embodiment, the program includes instructions that are used to perform one or more of the operations described below in relation to FIGS. 9 and 10.

Figure 2:
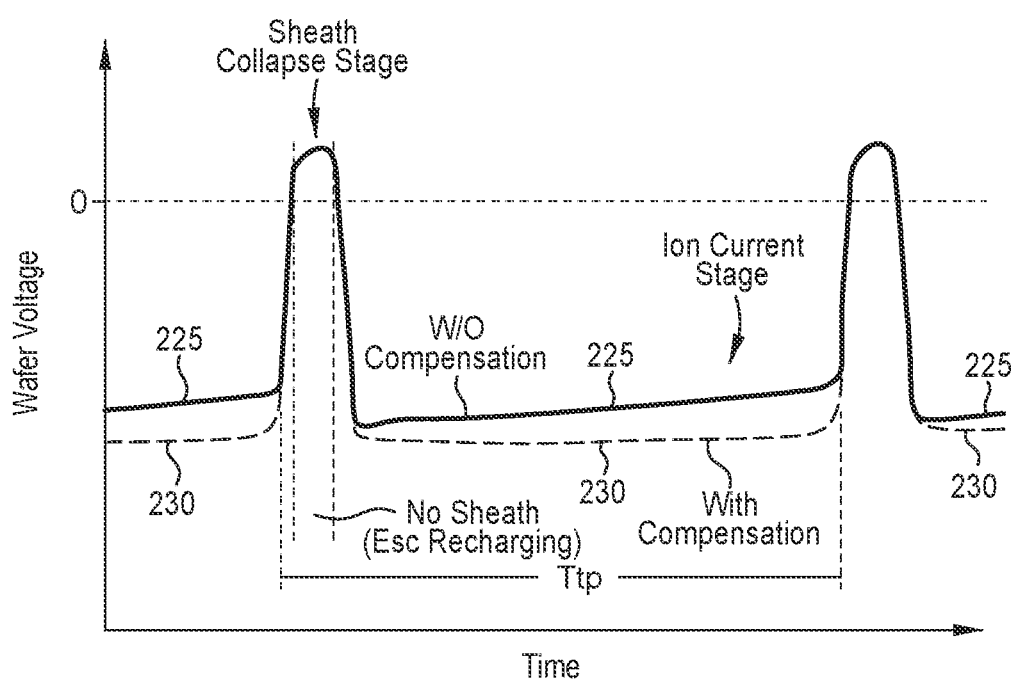
FIG. 2 illustrates two separate voltage waveforms established at a substrate disposed on a substrate support assembly of a processing chamber due to the delivery of pulsed voltage waveforms to one or more electrodes within the processing chamber, according to one or more embodiments.

FIG. 2 illustrates two separate voltage waveforms established at a substrate 103 disposed on the substrate receiving surface 105A of the substrate support assembly 136 of a processing chamber due to the delivery of pulsed voltage waveforms to the bias electrode 104 of the processing chamber, according to one or more embodiments. Waveform 225 is an example of a non-compensated pulsed voltage (PV) waveform established at the substrate 103 during plasma processing. Waveform 230 is an example of a compensated pulsed voltage (PV) waveform established at the substrate 103 by applying a negative slope waveform to the bias electrode 104 of the processing chamber during an "ion current stage" portion of the PV waveform cycle by use of the current source 177. The compensated pulsed voltage (PV) waveform can alternatively be established by applying a negative voltage ramp during the ion current stage of the pulsed voltage waveform generated by the PV waveform generator 175.

In FIG. 2 waveforms 225, and 230, include two main stages: an ion current stage and a sheath collapse stage. Both portions (the ion current stage and the sheath collapse stage) of the waveforms 225 and 230, can be alternately and/or separately established at the substrate 103 during plasma processing. At the beginning of the ion current stage, a drop in voltage at the substrate 103 is created, due to the delivery of a negative portion of a PV waveform (e.g., ion current portion) provided to the bias electrode 104 by the PV waveform generator 175, which creates a high voltage sheath above the substrate 103. The high voltage sheath allows the plasma generated positive ions to be accelerated towards the biased substrate during the ion current stage, and thus, for RIE processes, controls the amount and characteristics of the etching process that occurs on the surface of the substrate during plasma processing. In some embodiments, it is desirable for the ion current stage to generally include a region of a pulsed voltage waveform that achieves a voltage at the substrate that is stable or minimally varying throughout the stage, as illustrated in FIG. 2 by waveform 230. One will note that significant variations in voltage established at the substrate during the ion current stage, such as shown by the positive slope in the waveform 225, will undesirably cause a variation in the ion energy distribution (IED) and thus cause undesirable characteristics of the etched features to be formed in the substrate during an RIE process.

FIG. 3A is a plot 301 of a forward RF voltage waveform 331 and an inter-modulation distortion (IMD) generated RF voltage waveform 326 measured along a transmission line, such as transmission line 163 or 166 in FIG. 1. In one example, the plot 301 was generated from measurements made at a frequency of 40 MHz +/−400 kHz at a node within the RF power system 189 due to the delivery and interaction created between an RF voltage waveform 326 provided from the RF power system 189 at a frequency of about 40.68 MHz and a pulsed voltage waveforms provided from the DC power system 183, which are both illustrated in FIG. 3B. The plot 301 includes an envelope 370 of the forward RF voltage waveform 331, and an envelope 376 of the IMD generated RF voltage waveform 326 all created by an interaction between the delivery of RF bias voltage waveform provided from the components within a RF power system 189 and pulsed voltage waveforms provided from the PV waveform generator of the DC power system 183.

During processing, the forward RF voltage waveform 331 is applied to the load (e.g., gas) in the processing volume 129 of the processing chamber 100 through the transmission line, such as transmission line 165 (FIG. 1). If the impedance of the load is not properly matched to impedance of the source (e.g., RF signal generator), a portion of the waveform can reflect back in the opposite direction along the same transmission line. Thus, to prevent a substantial portion of the waveform from reflecting back along the transmission line, it is necessary to find a match impedance by adjusting one or more of the components with the impedance matching circuit 172 and/or adjusting the frequency of the RF bias waveform supplied by the RF waveform generator 171 to match the impedance of the load to the source during plasma processing. To properly match the impedance, the forward RF voltage and reflected RF voltage are measured at the driven RF frequency at a node within the RF power system 189. Measurements made using a conventional RF power delivery system using a conventional RF power delivery method allows the formation of the envelope 370 of the forward RF voltage waveform 331 and the envelope 376 of the IMD generated RF voltage waveform 326 that is not at one of the harmonic frequencies of the driven RF frequency. As illustrated in FIG. 3A, the magnitude of the envelope 376 of the IMD generated RF voltage waveform 326 undesirably varies over time and varies from a point that is near the magnitude of the envelope 370 of the forward RF voltage waveform 331 to a magnitude of the envelope 376 of the IMD generated RF voltage waveform 326 that is near a zero RF power.

FIG. 3B illustrates an example of a pulsed voltage waveform 321 delivered to the bias electrode 104 (FIG. 1) and a pulsed voltage waveform 322 delivered to the edge control electrode 115 (FIG. 1) that both further include a higher frequency of a RF voltage waveform 326 (e.g., 40 MHz RF signal) impressed on top of the pulsed voltage waveforms 321 and 322. As discussed above in relation to FIG. 2, the pulsed voltage waveforms include two main stages: an ion current stage, and a sheath collapse stage. Both portions (the ion current stage and the sheath collapse stage) of the pulsed voltage waveforms, are established at the substrate 103 during plasma processing. As noted above, in an RIE process the etching process primarily occurs during the second stage (e.g., the ion current stage) of the pulsed voltage waveform. Variations in the IMD generated RF power component as seen in FIG. 3A during both stages of the pulsed voltage waveform, which can cause substrate-to-substrate and/or chamber-to-chamber process result variations, and can cause damage to hardware components within the chamber and RF power system 189.

Figure 4:
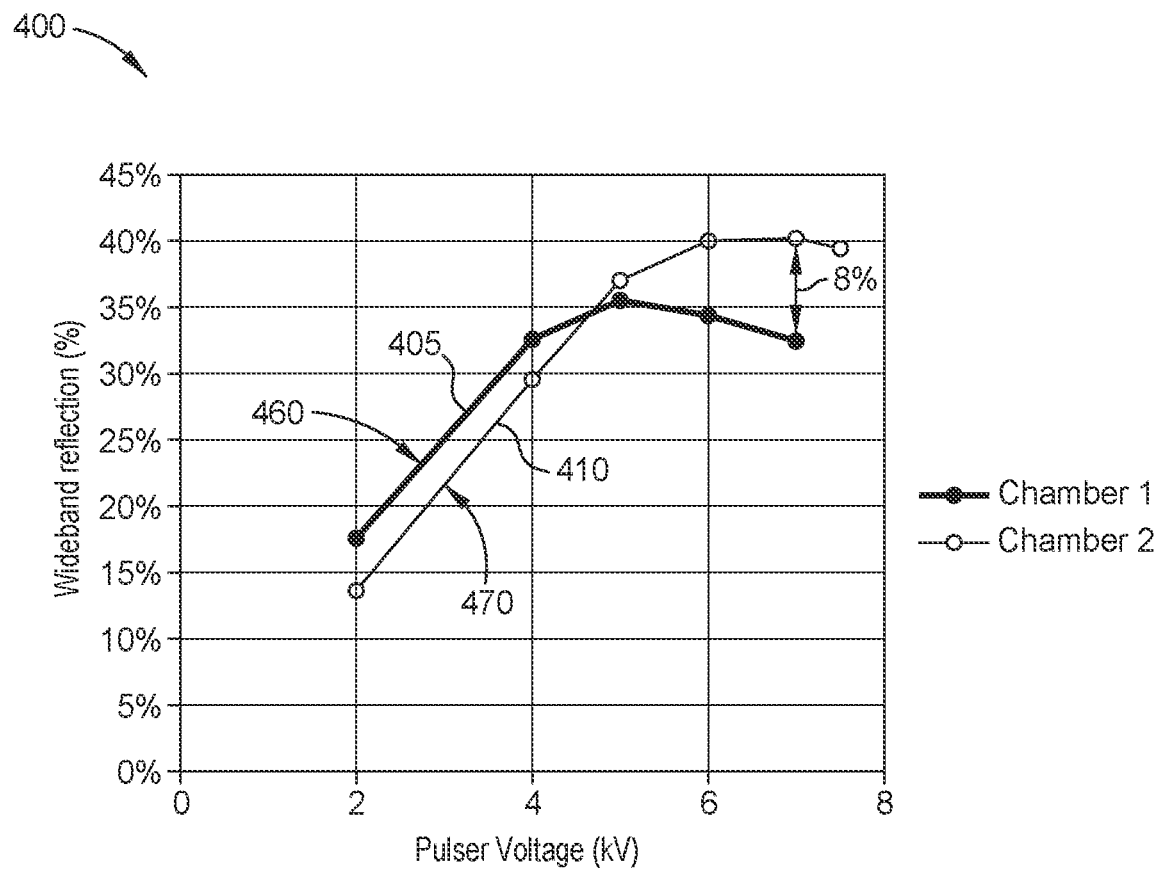
FIG. 4 is a chart illustrating the percentage of wide-band reflection seen in two different conventional plasma processing chambers, according to one embodiment.

FIG. 4 is a chart illustrating the percentage of wide-band reflection as seen in two different conventional plasma processing chambers. Wide-band reflection percentage is used to measure the amount of reflected power (i.e., amount of power that was not provided to the load), due to IMD and harmonic reflections found in the plasma processing system, versus the amount of forward RF power provided from the RF source. Curve 405 illustrates the percentage of reflected RF power as function of the magnitude of the pulsed voltage waveform applied to an electrode within a first processing chamber 460. Curve 410 illustrates the percentage of reflected RF power as function of the magnitude of the pulsed voltage waveform applied to an electrode within a second processing chamber 470, wherein the first and second processing chambers are substantially similarly configured and the plotted results were created by performing the same plasma processing recipes in each processing chamber. As illustrated in chart 400, by use of a conventional RF power delivery system that utilizes a conventional RF power delivery method the percentage of RF power delivered to the load will vary from chamber to chamber, and especially at high pulsed waveform voltages. As seen in FIG. 4, the percentage of energy lost to IMD increases as the voltage level of a pulsed voltage waveform voltage is increased, which is determined by the magnitude of the voltage established at the substrate during the ion current stage of the pulsed voltage waveform. Both curves 405 and 410 increase to a maximum percentage between about 4 kV and 8 kV. In this example, a plasma process that included the delivery of an RF power of about 1500 W, a chamber pressure of 9 mTorr, a pulsed voltage repetition frequency of 1000 Hz, and 59% DC power duty cycle, the percentage of energy lost to IMD seen within RF power delivery components in the first processing chamber 460 increased from about 2 kV to a peak at about 4.5 kV, and then started to fall off at voltages greater than 4.5 kV. Alternately, when the same process recipe was run in the second processing chamber 470, the percentage of reflected RF power formed in the second processing chamber 470 increases from about 2 kV to about 6 kV, and then falls off at about 7 kV. In this example, the difference in the reflected RF between the first processing chamber 460 to the second processing chamber 470 can be about 8 percent at the more desirable higher pulsed waveform voltage levels.

Figure 5A:
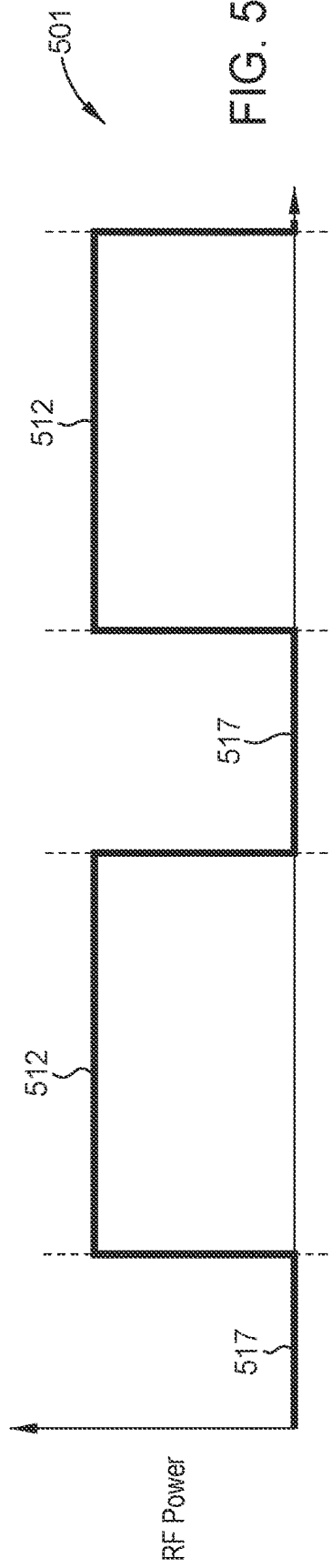
FIG. 5A illustrates a pulsed RF bias voltage signal applied to an electrode within a processing chamber, according to one embodiment.
Figure 5B:
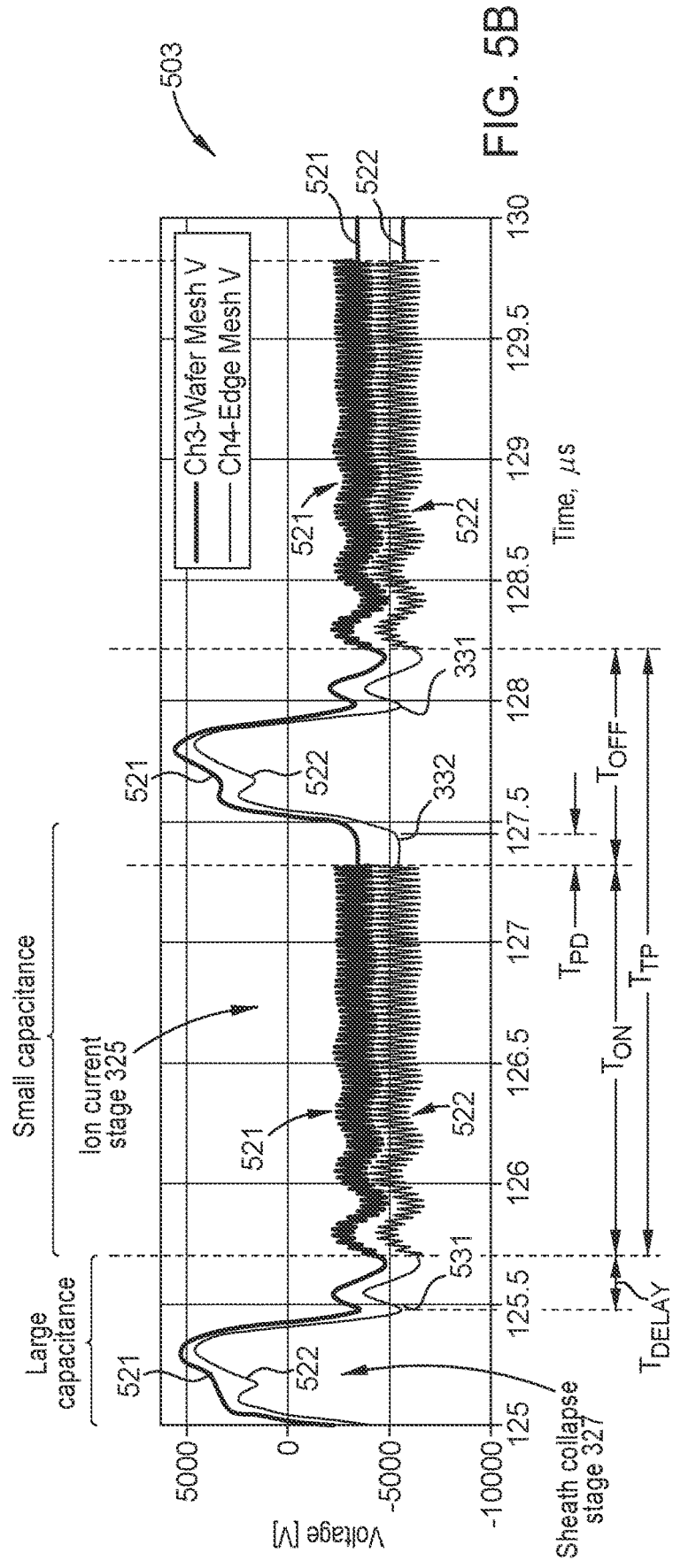
FIG. 5B illustrates a combined pulsed voltage waveform and pulsed RF bias voltage signal formed by the delivery of pulsed RF bias voltage signal illustrated in FIG. 5A and a pulsed voltage waveform to the one or more electrodes of the processing chamber, according to one embodiment.

FIG. 5A illustrates a pulsed RF waveform 501 applied to an electrode disposed within a processing chamber. The pulsed RF waveform 501 includes two stages: a RF power delivery stage 512 in which RF power is provided to an electrode within the processing chamber for a first period time ($T_{ON}$) and a RF power "off" stage 517 in which no RF power is provided to the electrode for a second period of time ($T_{OFF}$). FIG. 5B illustrates a plot of a pulsed voltage waveform and the pulsed RF bias voltage signal that are combined due to the delivery of the delivery of the pulsed RF bias voltage signal illustrated in FIG. 5A and a pulsed voltage waveforms 521 and 522, according to one embodiment. As similarly discussed in relation to pulsed voltage waveforms 321 and 322 in FIG. 3B, in one example, the pulsed voltage waveforms 521 and 522 are provided to one or more electrodes within the processing chamber, such as the bias electrode 104 and edge control electrode 115, respectively.

As shown in FIGS. 5A and 5B, the pulsed RF waveform 501 is synchronized with the delivery of at least one of the pulsed voltage waveforms 521 and 522, and overlaps with at least a portion of the pulsed voltage waveforms during the ion current stage. As shown, the RF power delivery stage 512, and thus the only time the impedance matching circuit 172 is utilized to deliver the RF power provided from the RF waveform generator 171 is during the stable portion of the provided pulsed voltage waveform. The delivery of the RF power during the stable, and from an RIE etching point of view the key stage in which most of the etching occurs, will prevent the impedance matching circuit 172 from trying to find a match point when the impedance of the load is rapidly changing between and during the different stages of the delivery of the pulsed voltage waveform. It is believed that by pulsing the RF waveform on during the ion current stage, and off during the sheath collapse stage will improve the performance of the impedance matching circuit by limiting the amount of impedance variation seen by the impedance matching circuit 172 when the RF power is provided to an electrode within the processing chamber 100. Thus, if the RF power is not pulsed, and maintained at a constant power as shown in FIG. 3B, the measured reflected RF power varies in magnitude between the sheath collapse stage 327 and the ion current stage as seen in the FIG. 3A. Therefore, in one embodiment of the disclosure provided herein, the pulsed RF waveform 501 comprises an RF signal that is provided for a significant portion of the ion current stage of the pulsed voltage waveform. In some embodiments, the duration of the RF power delivery stage 512 is configured to last the complete length of the ion current stage. In one configuration, the RF power provided during the RF power delivery stage 512 is synchronized, by use of the system controller 126, so that the RF power is provided within a region of the pulsed voltage waveform that extends between the ion current stage start 332 and the ion current stage end 333. In one configuration the PV waveform generator, and the RF power source behave in master slave relationship. Wherein the master will provide a timing signal (e.g., square wave TTL signal) that triggers the slave to deliver a waveform at a desired time. For example, the PV waveform generator is the master and the RF power source is the slave so that the RF waveform is delivered during a desired portion of the PV waveform. For example, the RF power source is the master, and the PV waveform generator is the slave so that the PV waveform signal is delivered during a desired portion of the RF waveform.

In some embodiments, where the RF waveform is only delivered during sheath collapse stage, the ion energy distribution function (IEDF) will be narrower than the case where the RF waveform is delivered during ion current stage, since the energy broadening effect provided to the ions in the plasma due to the delivery of the RF waveform not occurring while the sheath is formed, which is the stage where the plasma generated ions are being accelerated towards the substrate surface. Use of this RF waveform delivery method enables a more precise control of ion energy during the ion current stage of the waveform pulse.

In an alternative configuration, the pulsed RF waveform 501 is synchronized with the delivery of at least one of the pulsed voltage waveforms 521 and 522, and overlaps with at least a portion of the pulsed voltage waveforms during the sheath collapse stage. By pulsing the RF waveform on during the sheath collapse stage, and off during the ion current stage, the performance of the impedance matching circuit will improve by limiting the amount of impedance variation seen by the impedance matching circuit 172 when the RF power is provided to an electrode within the processing chamber 100. Thus, in one embodiment of the disclosure provided herein, the pulsed RF waveform 501 comprises an RF signal that is provided for a significant portion of the sheath collapse stage of the pulsed voltage waveform.

In some embodiments, as shown in FIG. 5B, the duration of the RF power delivery stage 512 is configured to only include a portion of the duration of the ion current stage. In this case, the RF power delivery stage 512 is synchronized, by use of the system controller 126, so that RF power is delivered after a first time delay ($T_{DELAY}$) has elapsed from the ion current stage start 332 and is stopped so that a second time delay ($T_{PD}$), or post-RF power delivery time delay, can elapse before the ion current stage end 333 has been reached and the next pulsed voltage waveform starts to be generated by the PV waveform generator 175. The first time delay ($T_{DELAY}$) can vary from about 1% to about 20% of the total length of the ion current stage of the pulsed voltage waveform, and can be helpful to reduce the variation in the IMD generated reflected power generated during the delivery of the RF waveform due to the natural variation (i.e., "ringing") found in the pulsed voltage waveform during the transition from the sheath collapse stage to the ion current stage. The second time delay ($T_{PD}$) can vary from about 0% to about 10% of the total length of the ion current stage of the pulsed voltage waveform, and can be helpful to reduce any variation in the IMD generated reflected power due to the variation in the start to the transition from the ion current stage to the sheath collapse stage. In one example, the second time delay ($T_{PD}$) is between 0.1% and 10% of the total length of the ion current stage of the pulsed voltage waveform. In some embodiments, the ion current stage accounts for between about 30% and about 95% of the total period ($T_{TP}$) of the pulsed voltage waveform, and is typically greater than about 80% of the total period of the pulsed voltage waveform. The pulsed voltage waveform can include a series of voltage pulses that are delivered at a repetition frequency that is greater than or equal to 100 kHz, such as greater than 200 kHz, or greater than 400 kHz, or even in a range between 100 kHz and 500 kHz. In one example, the total period ($T_{TP}$) of the pulsed voltage waveform is about 2.5 microseconds (μs). Whether the RF waveform is provided during the sheath collapse stage or the ion current stage, the IMD power back to the generator can be greatly reduced, for example by more than five times, which can allow the generator to reach higher delivered power before stressing the output amplifier components within the generator.

Figure 6:
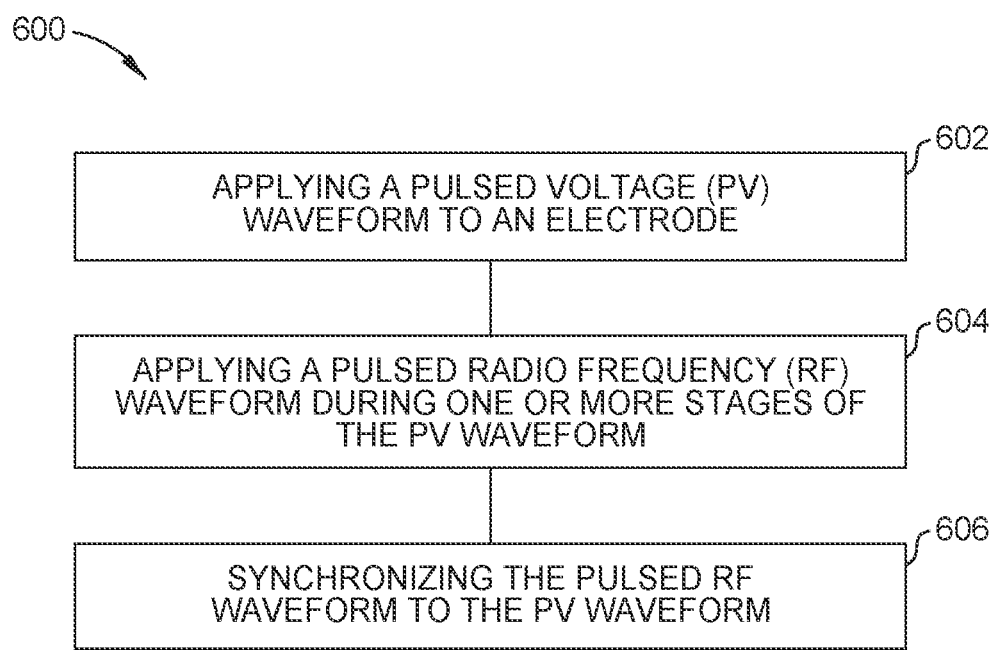
FIG. 6 is a flow diagram illustrating a method for synchronizing a PV waveform and a RF bias voltage waveform in the plasma processing system, according to one embodiment.

FIG. 6 is a diagram illustrating a method for synchronizing the PV waveform and the RF waveform in the plasma processing chamber, such as the processing chamber 100 of FIG. 1. The method 600 includes a method of processing a substrate by applying a PV waveform to an electrode, applying a pulsed RF waveform to an electrode, and synchronizing the pulsed RF waveform to the PV waveform.

At activity 602, the method 600 includes applying a PV waveform to an electrode, such as the bias electrode 104. The PV waveform can include a series of voltage pulses, wherein each pulse of the series of pulse includes a first stage and a second stage. The first stage includes a sheath collapse stage, and the second stage includes an ion current stage that are established at the substrate during processing. As noted in FIG. 5B and also discussed above, the sheath collapse stage includes a large capacitance measured at the substrate, while the ion current stage includes a small capacitance measured at the substrate.

At activity 604, the method 600 includes generating a plasma in a processing volume of a processing chamber. In some embodiments, a pulsed RF waveform is used to ignite one or more gas species flowed into the processing volume 129 of a processing chamber 100 to form a plasma over a substrate disposed on a supporting surface of a substrate support by delivering an RF signal to one or more electrodes within the processing chamber 100. In some cases, the RF waveform 501 includes an RF signal that has a frequency between 1 MHz and 60 MHz. In one example, the RF waveform 501 includes an RF signal that has a frequency of 40 MHz. Activities 602 and 604 can be completed substantially simultaneously, or in any desired order.

At activity 606, the method 600 includes synchronizing the pulsed RF waveform with the PV waveform. As discussed above, the pulsed RF waveform is pulsed so that the RF power delivery stage 512 of the pulsed RF waveform is synchronized with at least one stage of PV waveform. In one embodiment, to perform the task of synchronizing the pulsed RF waveform and a pulsed voltage waveform the system controller 126 delivers one or more control signals to the RF waveform generator 171 and a PV waveform generator 175 so that the timing of the delivery of each of the waveforms generated by these components can be synchronized, such as synchronized as similarly described above in relation to FIG. 5A-5B. Alternately, in another embodiment, the RF waveform generator 171 acts as a master device and thus sends a control signal to a PV waveform generator 175 so that the timing of the delivery of each of the waveforms generated by these components can be synchronized. In another embodiment, the PV waveform generator 175 acts as a master device and thus sends a control signal to the RF waveform generator 171 so that the timing of the delivery of each of the waveforms generated by these components can be synchronized.

The activities performed in method 600 can be performed for a period of time to allow a desirable plasma process to be performed on a substrate disposed within the plasma processing chamber.

While the foregoing is directed to embodiments of the present disclosure, other and further embodiments of the disclosure may be devised without departing from the basic scope thereof, and the scope thereof is determined by the claims that follow.

What is claimed is:

1. A plasma processing system, comprising:
a pulsed voltage waveform generator coupled to a first electrode;
a radio frequency (RF) waveform generator coupled to a second electrode, wherein the radio frequency waveform generator is configured to generate a plasma within a processing volume of the plasma processing system;
an impedance matching circuit coupled between the radio frequency waveform generator and the second electrode; and
a controller having a processor configured to execute computer-readable instructions stored within memory that cause the system to:
apply, by use of the pulsed voltage waveform generator, a pulsed voltage waveform to the first electrode, the pulsed voltage waveform comprising a series of voltage pulses that each comprise a first stage and a second stage;
apply, by use of the radio frequency waveform generator, a pulsed RF waveform to the second electrode to generate a plasma in a processing region of a processing chamber; and
synchronize the pulsed RF waveform with each pulse of the pulsed voltage waveform, such that an RF waveform of the pulsed RF waveform is provided only during at least a portion of the second stage of each pulse of the pulsed voltage waveform.

2. The plasma processing system of claim 1, wherein the first stage of the pulsed voltage waveform includes a sheath collapse stage and the second stage of the pulsed voltage waveform includes an ion current stage.

3. The plasma processing system of claim 1, wherein the series of voltage pulses are delivered at a frequency that is greater than or equal to 100 kHz.

4. The plasma processing system of claim 3, wherein the pulsed RF waveform comprises a series of RF pulses that are delivered at a frequency that is equal to the frequency of the series of voltage pulses.

5. The plasma processing system of claim 1, wherein the first electrode is disposed in a substrate support, which comprises a substrate supporting surface that is configured to support a substrate disposed within the processing region of the processing chamber.

6. The plasma processing system of claim 5, wherein
the second electrode is disposed within the substrate support; and
the first electrode is disposed between the second electrode and the substrate supporting surface.

7. The plasma processing system of claim 5, further comprising a third electrode, wherein the third electrode surrounds the first electrode and is electrically coupled to the pulsed voltage waveform generator.

8. The plasma processing system of claim 5, wherein the first electrode is electrically coupled to a clamping network that comprises a DC voltage supply.

9. The plasma processing system of claim 1, wherein the RF waveform of the pulsed RF waveform is applied after a first time delay has elapsed, wherein the first time delay begins at an end of the first stage of each voltage pulse of the pulsed voltage waveform.

10. The plasma processing system of claim 9, wherein the first time delay has a length that is between 1% and 20% of a total length of the second stage of the pulsed voltage waveform.

11. The plasma processing system of claim 1, wherein the first stage of each voltage pulse of the pulsed voltage waveform begins after a second time delay has elapsed, wherein a start of the second time delay begins at an end of a period in which the RF waveform of the pulsed RF waveform is provided during the at least a portion of the second stage.

12. The plasma processing system of claim 11, wherein the second time delay has a length that is between 0.1% and 10% of a total length of the second stage of the pulsed voltage waveform.

13. The plasma processing system of claim 1, wherein the pulsed voltage waveform is positive during the first stage.

14. The plasma processing system of claim 1, wherein the pulsed voltage waveform is negative during the second stage.

15. The plasma processing system of claim 1, wherein the impedance matching circuit is disposed between the RF waveform generator and one of the first electrode and the second electrode, and wherein the impedance matching circuit matches an impedance of a load to an impedance of the RF waveform generator during the second stage of each voltage pulse of the pulsed voltage waveform when the pulsed voltage waveform is provided to one of the first electrode and the second electrode.

16. The plasma processing system of claim 1, wherein the series of voltage pulses are delivered at a frequency that is greater than or equal to 100 kHz and less than or equal to 500 kHz.

17. The plasma processing system of claim 16, wherein the pulsed RF waveform is provided at a frequency between 1 MHz and 200 MHz.

18. The plasma processing system of claim 1, wherein the processor is further configured to cause the controller to deliver one or more control signals to the RF waveform generator and the pulsed voltage waveform generator to cause the synchronization of the pulsed RF waveform with each pulse of the pulsed voltage waveform.

19. The plasma processing system of claim 1, wherein the synchronization of the pulsed RF waveform with each pulse of the pulsed voltage waveform comprises the RF waveform generator sending a control signal to the pulsed voltage waveform generator.

20. The plasma processing system of claim 1, wherein the synchronization of the pulsed RF waveform with each pulse of the pulsed voltage waveform comprises the pulsed voltage waveform generator sending a control signal to the RF waveform generator.

* * * * *